(12) United States Patent
Roolf et al.

(10) Patent No.: US 12,731,470 B2
(45) Date of Patent: Sep. 8, 2026

(54) ELECTRICAL DEVICE HAVING AN INDICATOR LIGHT

(71) Applicant: Murrelektronik GmbH, Oppenweiler (DE)

(72) Inventors: Tim Roolf, Oppenweiler (DE); Heiko Feißt, Oppenweiler (DE); Henrik Ruf, Oppenweiler (DE)

(73) Assignee: Murrelektronik GmbH, Oppenweiler (DE)

( * ) Notice: Subject to any disclaimer, the term of this patent is extended or adjusted under 35 U.S.C. 154(b) by 1 day.

(21) Appl. No.: 18/956,728

(22) Filed: Nov. 22, 2024

(65) Prior Publication Data

US 2025/0174096 A1 May 29, 2025

(30) Foreign Application Priority Data

Nov. 23, 2023 (DE) ..................... 10 2023 132 754.2

(51) Int. Cl.
*G08B 5/36* (2006.01)
*H05K 5/02* (2006.01)

(52) U.S. Cl.
CPC ............. *G08B 5/36* (2013.01); *H05K 5/0217* (2013.01)

(58) Field of Classification Search
CPC .... G08B 5/36; H05K 5/0217; G09F 13/0427; G09F 2013/222; G09F 7/165;
(Continued)

(56) References Cited

U.S. PATENT DOCUMENTS

| | | | |
|---|---|---|---|
| 7,113,196 | B2 | 9/2006 | Kerr |
| 10,743,972 | B2 | 8/2020 | Greer, Jr. |

(Continued)

FOREIGN PATENT DOCUMENTS

| | | | |
|---|---|---|---|
| DE | 60215391 | T2 | 10/2007 |
| DE | 102011107388 | A1 | 1/2012 |

(Continued)

OTHER PUBLICATIONS

Hartl et al., Dr. E., "Lichtwellenleiter mit mechanisch eingebrachten Mikrostrukturen (LIMMS)", Scientific Journal Series Technical University Nuremberg Georg Simon Ohm, 2014, Dec. 2014, 8 pages.

*Primary Examiner* — Omeed Alizada
(74) *Attorney, Agent, or Firm* — Dilworth IP, LLC

(57) ABSTRACT

An electrical device with an indicator light includes a housing and a light source which is arranged in the housing and is set up to couple light into a housing wall of the housing, which propagates through the material of the housing wall to a light-decoupling part of the housing. The light emitted by the light source can exit the housing through the light-decoupling part of the housing. The indicator light is formed by at least the light-decoupling part of the housing. The light-decoupling part of the housing or a non-light-decoupling part of the housing which delimits the light-decoupling part of the housing is produced by a local mechanical, chemical and/or physical treatment of the housing. The treatment is carried out in a fully assembled state of the electrical device. Furthermore, embodiments of the present disclosure relate to a method of manufacturing the electrical device.

18 Claims, 2 Drawing Sheets

(58) Field of Classification Search
CPC ...... G09F 13/0413; G09F 13/08; G09F 23/00; H01H 2219/062; H01H 13/83; G02B 6/0095
See application file for complete search history.

(56) References Cited

U.S. PATENT DOCUMENTS

| | | | | |
|---|---|---|---|---|
| 11,385,399 | B1 | 7/2022 | Bräysy | |
| 11,982,830 | B2 | 5/2024 | Nielsen et al. | |
| 2010/0186214 | A1 * | 7/2010 | Judge | B60Q 3/217<br>29/445 |
| 2019/0008620 | A1 * | 1/2019 | Greer, Jr. | F21V 33/004 |
| 2019/0064431 | A1 * | 2/2019 | Keränen | G02B 6/0031 |

FOREIGN PATENT DOCUMENTS

| | | | |
|---|---|---|---|
| DE | 102016214644 | A1 | 2/2018 |
| EP | 1619937 | B1 | 3/2008 |
| EP | 2322962 | A1 | 5/2011 |
| WO | 202209636 5 | A1 | 5/2022 |

* cited by examiner

ELECTRICAL DEVICE HAVING AN INDICATOR LIGHT

CROSS REFERENCE TO RELATED APPLICATION

This application claims priority to German Patent Application No. 10 2023 132 754.2, filed Nov. 23, 2023, the entire contents of which are hereby expressly incorporated herein by this reference including, without limitation, the specification, claims and abstract, as well as any figures, tables, or drawings thereof.

TECHNICAL FIELD

Embodiments of the present disclosure relate to an electrical device having an indicator light and to a method for the manufacture thereof.

BACKGROUND

In the electrical devices known from the prior art, light-emitting diodes are often used to signal operating states. For example, states such as the power supply ("power on"), errors or specific functions can be displayed. To implement the indicator light, corresponding openings are produced in the housing which surrounds and protects the electrical device, to which either the light-emitting diodes or light guides interacting with the light-emitting diodes are assigned.

Special display symbols can be created, for example, by masks, which are usually made of a non-transparent layer. This layer may for example be a colored layer or consist of a perforated or punched material.

Conventional indicator lights are usually manufactured using tool-based parts. An individually adapted tool is then required for each new optical design of the indicator light. As a result, either the light guides have to be manufactured in the corresponding shape and integrated into the housing, or light guides already present in the housing have to be partially covered, e.g. by printing, in particular pad printing. As this is technically complicated, it is often not possible to implement in particular small batch sizes or special products having an individualized display image in an economically reasonable manner.

The object is therefore to provide an electrical device having an indicator light which is technically simple to implement and can also be manufactured cost-effectively in small to medium batch sizes.

SUMMARY

According to the present disclosure, the object is achieved by an electrical device having an indicator light, comprising a housing and a light source arranged in the housing. The light source is set up to couple light into a housing wall of the housing, which propagates through the material of the housing wall to a light-decoupling part of the housing, through which the light emitted by the light source can exit the housing. The indicator light is formed by at least the light-decoupling part of the housing. The light-decoupling part of the housing or a non-light-decoupling part of the housing which delimits the light-decoupling part of the housing has been produced by a local mechanical, chemical and/or physical treatment of the housing, wherein the treatment is carried out in a fully assembled state of the electrical device.

"A fully assembled state" means that all component parts of the electrical device are already connected to each other, i.e. mechanically and/or electrically connected. In other words, in the fully assembled state, at least the hardware components are fully contained in the housing. Configuring the electrical device and/or installing software, in particular customized software, is not part of the assembly process in this sense and can also be carried out after the indicator light of the electrical device according to the present disclosure has been produced.

The basic idea is to produce the indicator light only in the fully assembled state of the electrical device, without breaking through the housing, i.e. without producing a break or a continuous opening in the housing. The housing does not have to be opened afterwards either. On the one hand, a high degree of individualization of the indicator light is achieved and, on the other hand, it is ensured that the components of the electrical device received in the housing are always sufficiently protected by the housing, in particular from moisture.

In addition, it is possible to manufacture large quantities of the electrical devices in a basic state. Subsequently, the respective electrical device in the basic state, which is fully assembled, can be customized with regard to the indicator light, in particular the light-decoupling part. This results in correspondingly short manufacturing times and low manufacturing costs for special products or small batch sizes.

In particular, this type of manufacture ensures that the protection standards required depending on the type of device or application are met, for example the protection standard IP44, IP67 and/or IP 69K, which is required for numerous devices.

In one variant embodiment, it is provided that the light-decoupling part of the housing is formed by a modification of the housing wall. The interior of the electrical device and the electrical or electronic components or parts arranged therein thus remain protected during the treatment, in particular also from residues which may form during the treatment itself, for example chips or vapor.

The material of the housing wall may be a plastic material which includes additives designed to locally change the optical properties of the material through the mechanical, chemical and/or physical treatment to form the light-decoupling part of the housing, in particular in a defined manner. The additives may be used to realize a desired customization of the indicator light in a defined manner, as the additives are excited by a laser, for example, to set a degree of translucency. Furthermore, the housing, which comprises plastic material, may be manufactured quickly and cost-effectively, for example by injection molding.

Preferably, the light-decoupling part of the housing and the non-light-decoupling part of the housing are continuously connected to each other in terms of material. Possible weak points at the transition between the two parts are thus avoided.

In one variant of the electrical device, at least the light-decoupling part of the housing comprises at least one optical diffuser. The optical diffuser scatters the light striking it in the housing wall, as a result of which an effective light-decoupling from the housing wall can be achieved.

The at least one optical diffuser may be a three-dimensional structure which has been incorporated into the housing wall by the treatment, e.g. a recess in the housing wall. Alternatively, the at least one optical diffuser may be an area incorporated into the housing by the treatment and the material of which has been changed. For example, a laser treatment may locally modify plastic material of the housing wall (partially decomposed, crystallized, etc.), thus forming opaque areas in the housing wall which scatter the light and thus enable or improve the decoupling of light from the housing.

Basically, the aforementioned additives may also be regarded as interferers of the housing structure, at which a light reflection or diffusion of the light coupled into the housing takes place. Accordingly, the additives may (additionally) also act as diffusers. The light-decoupling part may arise in the area of the additives.

Furthermore, it is conceivable that the housing encloses an interior space of the electrical device entirely and/or on all sides, so that all provided electrical or electronic parts/components are received in the housing. Only one or more connections are attached to the outside of the housing to connect the electrical device or to connect it to other devices. As a result, a particularly good protection of the electronic components is ensured, and a high standard of protection is achieved.

The object of the present disclosure is further achieved by a method of manufacturing an electrical device according to embodiments the present disclosure, comprising the steps of:

- providing an electrical device in a fully assembled state, which has a housing in which all electrical and/or electronic components of the electrical device are received;
- manufacturing a light-decoupling part of the housing by a local mechanical, chemical and/or physical treatment of the housing in the fully assembled state.

The advantages discussed in relation to the electrical device apply equally to the method according to the present disclosure.

In one variant of the method, it is provided that the treatment of the housing is carried out by a mechanical removal and/or a laser ablation of an opaque covering layer of the housing. Alternatively or additionally, the local treatment of the housing may be carried out by selective exposure to light, in particular by means of a laser, which changes the optical properties of the material of the housing. For example, local light diffusers can be produced in the housing wall and/or the material of the housing can be changed so that it becomes more opaque or more transparent. All these measures may be applied to the fully assembled electrical device to quickly and cost-effectively implement an indicator light in the housing wall without having to break through the housing or to incorporate a break in the housing.

Furthermore, it is conceivable that before or after the manufacture of the light-decoupling part of the housing, only software associated with the light-decoupling part of the housing is installed to produce the operational electrical device. In this way, it is possible to produce an individualized electrical device in a technically simple and cost-effective manner, which may also be recognized as such by the light-decoupling part of the housing or the indicator light.

The cost-effective manufacture of the individualized electrical device is possible as the electrical devices are initially manufactured in large quantities (large batch) in a basic state, i.e. in a fully assembled state in which all electrical and/or electronic components are already received in the housing. The fully assembled electrical device may then be individually adapted to the customer, i.e. customized, with regard to the indicator light, in particular the light-decoupling part. However, the tools for manufacturing the electrical devices are the same, as the tools are used to manufacture the electrical device in its basic state, i.e. in its fully assembled state.

In other words, it is not necessary to provide separate manufacturing tools for the desired individualization, which would make the costs of small quantities (small batches or special products) correspondingly high.

BRIEF DESCRIPTION OF THE DRAWINGS

Further features and advantages of the present disclosure will become apparent from the following description and from the drawings to which reference is made and in which.

DETAILED DESCRIPTION

Figures 1, 2, 3:
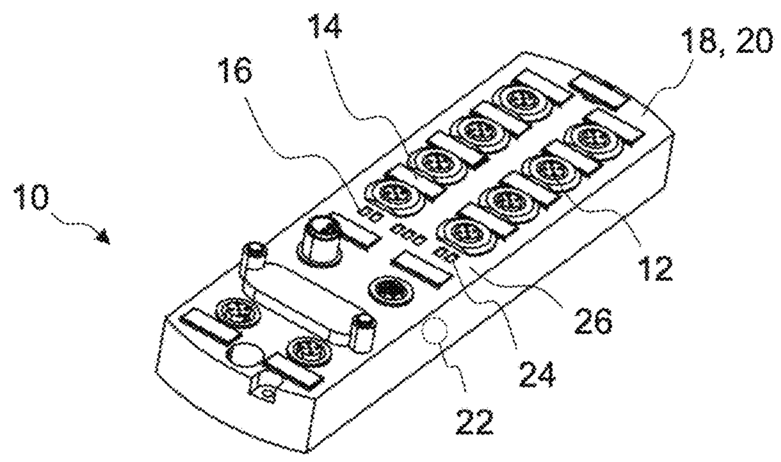
FIG. 1 shows a schematic three-dimensional representation of an electrical device according to the present disclosure in accordance with an exemplary embodiment.
FIG. 2 shows a schematic three-dimensional representation of a manufacturing step of a light-decoupling housing part of the electrical device according to the present disclosure by laser treatment.
FIG. 3 shows a schematic three-dimensional representation of a manufacturing step of a light-decoupling housing part of the electrical device according to the present disclosure by mechanical processing.

FIG. 1 shows a schematic three-dimensional representation of an electrical device 10 according to an embodiment of the present disclosure. In the example embodiment shown, the electrical device 10 is an electronic module, in particular for industrial applications.

The electrical device 10 has a plurality of connections 12 and connection-specific indicator lights 14, i.e., indicator lights 14 via which a state of the associated connection 12 can be displayed. In addition, the electrical device 10 also has a module-specific indicator light 16 which, for example, can display information about a configuration or software of the electrical device 10, i.e. generally information relating to the entire electrical device 10.

The outer shell of the electrical device 10 is formed by a housing 18 having a housing wall 20. In the example embodiment, the housing 18 consists of a transparent injection-molded plastic material. The outside of the housing 18 and the housing wall 20 is at least partially coated in an opaque manner, for example, painted.

The housing 18 encloses the electrical device 10 entirely and on all sides, except for openings for the connections 12.

All electrical/electronic parts or components of the electrical device 10 are received in the housing 18. They are thus protected from environmental influences such as dust or moisture.

To implement the indicator light 16, the electrical device 10 has a light source 22 inside the housing 18, for example an LED or an LED array.

In the example embodiment, the light source 22 is designed and set up to couple light into the housing wall 20 of the housing 18. The coupling of light into the housing 18 can, for example, be carried out through a side wall and/or a specially shaped coupling area 23 of the housing 18. A light guide can also be provided, by means of which light is conducted from the light source 22 to the coupling area 23 of the housing 18. The light coupled in via the coupling area 23 of the housing 18 then propagates through the material of the housing wall 20.

The housing wall 20 has a light-decoupling part 24, which forms the light indicator 16 and through which the light of the light source 22 propagating in the housing wall 20 can exit the housing wall 20.

Furthermore, the housing wall 20 has a non-light-decoupling part 26, for example made of opaque or opaque-coated plastic material, which delimits the light-decoupling part 24 of the housing 18.

The shape, size and/or assignment of the light-decoupling part 24 and the non-light-decoupling part 26 allow symbols and the like to be realized on the outside of the housing 18.

In the example embodiment, the light-decoupling part 24 and the non-light-decoupling part 26 are formed as a continuous injection-molded part and are thus connected to each other with regard to material, that is, they are formed with an intermaterial bond. As a result, the transition between the two parts 24, 26 is particularly robust.

In the example embodiment, the light-decoupling part 24 of the housing 18 has been produced in a fully assembled state of the electrical device 10 by a local treatment of the housing 18 with a laser 28, that is to say after all the electrical or electronic components have already been introduced into the housing 18. The electrical or electronic components have been connected both mechanically and electrically.

The manufacturing step of the local treatment is shown schematically in FIG. 2.

As can be seen from the representation, the light-decoupling part 24 of the housing 18 is formed by a local change in the housing wall 20, namely by a partial removal of an opaque covering layer 30 of the housing 18. Preferably, the covering layer 30 is located on the outside of the housing. Alternatively, it can however also be applied to the inside of the housing.

The covering layer 30 itself can be applied by various methods, in particular by a two-component injection molding process, painting, printing or foiling by heat sealing or in-mold labeling (IML).

Alternatively, the light-decoupling part 24 of the housing 18 can also be produced by a local chemical treatment or mechanical processing of the housing 18 in a fully assembled state of the electrical device 10.

FIG. 3 shows such a mechanical treatment or processing, in which an opaque covering layer 30 of the housing 18 is removed by means of a milling tool 32 to expose the underlying transparent plastic material in some areas.

The types of treatment of the housing 18 shown in FIGS. 2 and 3 are, of course, not to be understood in a restrictive way. Material removal by water jet engraving or planing or similar is also conceivable.

It is also possible that the housing 18 consists of a material which includes additives designed to locally change the optical properties of the material by the mechanical, chemical and/or physical treatment to form the light-decoupling part 24 of the housing 18. In other words, the translucency of the additives is modified, for example, by laser irradiation, as a result of which the area in which the additives are provided becomes more opaque or more transparent, which finally depends on the laser and/or the additives used.

For example, the material may be a plastic the opacity of which can be adjusted locally in a purposeful manner from transparent to completely opaque by treatment with a laser 28, in particular by excitation of the additives included. This also allows backlit symbols and/or lettering in the indicator light 16 to be produced in a quick and simple manner.

The light-decoupling part 24 of the housing 18 can also be formed by the treatment introducing local defects and/or optical diffusers 34 into the housing wall 20, which decouple the light from the housing wall 20. The additives could also, if desired, act as such diffusers 34.

Figure 4:
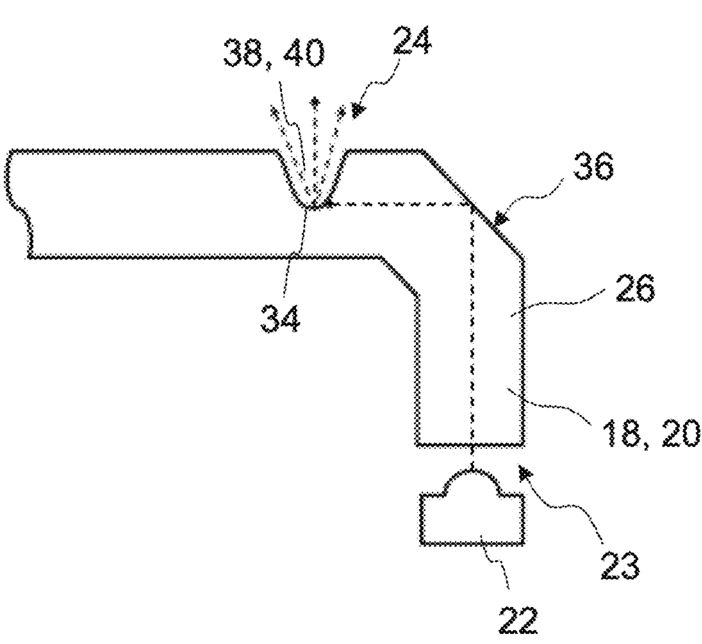
FIG. 4 shows a schematic sectional view of a portion of the housing of the electrical device according to the present disclosure with a recess which acts as a diffuser.

FIG. 4 shows a sectional view of a portion of a housing 18 into which light from the light source 22 is coupled into the housing wall 20, in particular via a side wall of the housing 18. The housing wall 20 is designed by the choice of material and construction, such that the coupled light is conducted to the light-decoupling part 24 of the housing 18. In this respect, the light can be coupled in at a point of the housing 18, which is spaced apart from the light-decoupling part 24 of the housing 20. In other words, the coupling area 23 is spaced apart from the light-decoupling part 24. The housing 18 or the housing material thus represents a light guide.

The light-decoupling part 24 is located, for example, on a front side of the housing 18. In the example embodiment, the housing 18 has a surface 36 at which the light coupled in is reflected. In the illustrated example embodiment, the surface 36, which can therefore also be referred to as a reflective surface, is oriented at an angle of 45° to the side wall and to the front side of the housing 18. Due to the angle and the light refraction properties of the housing material, total reflection occurs at the surface 36, so that the light coupled in is (substantially) completely conducted from the side wall to the front side of the housing 18, as shown in FIG. 4.

The housing 18 can therefore be designed so that total reflection of the light coupled in takes place in certain areas within the housing wall 20. In this way, a luminous flux can be generated in the housing wall 20 which runs parallel to the display plane (independently of the coupling). The coupling area 23 and the light-decoupling part 24 of the housing 20 can therefore be spatially separated from each other.

In the example shown in FIG. 4, the light is decoupled through a three-dimensional structure 38 (in the present case a recess 40) which has been created by a local treatment (for example by milling, engraving or by embossing using needles) in the housing wall 20 or a surface section of the housing wall 20 and at which light is scattered. As a result of the scattering, at least a portion of the luminous flux can be decoupled from the housing 18.

Figure 5:
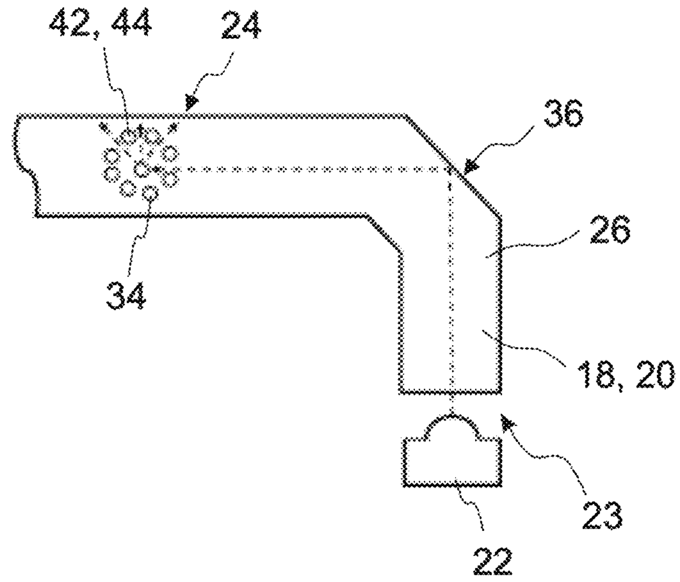
FIG. 5 shows a schematic sectional view of a portion of the housing of the electrical device according to the present disclosure with optical diffusers inside the housing wall.

Alternatively, or additionally, it is also possible to provide areas 42 which are incorporated into the housing 18, have a modified material and act as optical diffusers 34. This is shown schematically in FIG. 5. As explained above, the diffusers 34 may also be additives.

The areas 42 with modified material may, for example, be partially decomposed or partially crystallized opaque spots 44 in an otherwise transparent plastic matrix, which have been specifically created by the local treatment, for example by irradiating the additives.

The diffusers 34 incorporated in a defined manner make it possible to generate very precise emissions from the luminous flux of the housing wall 20 and to produce very fine symbols or lettering. A further advantage of this type of light decoupling is that there is no or only a very slight weakening of the housing material. In addition, a continuous outer surface the housing 18 is achieved, so that no deposits can accumulate. For this reason, this method is particularly suitable for applications in which cleanliness and purity are of utmost importance, for example in the food or pharmaceutical field.

The electrical device 10 having an indicator light 16 shown in FIG. 1 has been manufactured using an example embodiment of a method according to an embodiment of the present disclosure. The method and the steps thereof are briefly explained below.

In a first step of the method, an electrical device 10 is provided in a fully assembled state, which has a housing 18 in which all electronic/electrical components of the electrical device 10 are received. The hardware is therefore already fully installed, so that the electrical device 10 is in a basic state which is identical for all electrical devices 10, so that one tool or one tool set is sufficient to manufacture the electrical devices 10.

In a second step of the method, a light-decoupling part 24 of the housing 18 is produced by a local mechanical, chemical and/or physical treatment of the housing 18 in the fully assembled state, i.e. in the state in which the hardware is fully installed.

As already explained with reference to FIGS. 2 and 3, the local treatment of the housing 18 can be carried out by a mechanical removal and/or laser ablation of an opaque covering layer 30 of the housing 18.

Alternatively, or additionally, the local treatment of the housing 18 can be carried out by selective exposure to light, in particular by means of a laser 28, which changes the optical properties of the material of the housing 18. It is conceivable that the opacity of a housing 18 made of a plastic material with special laser-active additives can be purposefully modified locally by the laser treatment to define light-decoupling parts 24 and/or non-light-decoupling parts 26 of the housing 18 and thus form the indicator light 16.

In a further step of the method, software can be installed onto the electrical device 10 before or after the production of the light-decoupling part 24 of the housing 18. The software to be installed can be associated in particular with the light-decoupling part 24 of the housing 18 to ensure that in certain operating states, the light is decoupled via the light-decoupling part 24 of the housing 18, i.e. the light source 22 is activated accordingly. For example, the indicator light 16 can be designed to indicate the device type and/or device function defined by the software.

List of Reference Numerals

| Reference numeral | Designation |
|---|---|
| 10 | electrical device |
| 12 | connection |
| 14 | connection-specific indicator light |
| 16 | module-specific indicator light |
| 18 | housing |
| 20 | housing wall |
| 22 | light source |
| 23 | coupling area |
| 24 | light-decoupling part |
| 26 | non-light-decoupling part |
| 28 | laser |
| 30 | covering layer |
| 32 | milling tool |
| 34 | diffuser |
| 36 | surface |
| 38 | structure |
| 40 | recess |
| 42 | area with modified material |
| 44 | opaque spot |

We claim:

1. An electrical device having an indicator light, comprising:

a housing; and a light source arranged in the housing and set up to couple light into a housing wall of the housing, wherein the light propagates through a material of the housing wall to a light-decoupling part of the housing, wherein the light emitted by the light source can exit the housing through the light-decoupling part of the housing, wherein the indicator light is formed by at least the light-decoupling part of the housing, wherein the light-decoupling part of the housing or a non-light-decoupling part of the housing which delimits the light-decoupling part of the housing is produced by a local mechanical, chemical and/or physical treatment of the housing, wherein the treatment is carried out in a fully assembled state of the electrical device in which all component parts of the electrical device are already connected to each other.

2. The electrical device according to claim 1, wherein the light-decoupling part of the housing is formed by a modification of the housing wall.

3. The electrical device according to claim 1, wherein the material of the housing wall is a plastic material which includes additives, the additives being designed to change optical properties of the material locally by the local mechanical, chemical and/or physical treatment to form the light-decoupling part of the housing.

4. The electrical device according to claim 1, wherein the light-decoupling part of the housing and the non-light-decoupling part of the housing are continuously connected to each other in terms of material.

5. The electrical device according to claim 1, wherein at least the light-decoupling part of the housing comprises at least one optical diffuser.

6. The electrical device according to claim 5, wherein the at least one optical diffuser is a three-dimensional structure incorporated into the housing wall by the treatment.

7. The electrical device according to claim 6, wherein the three-dimensional structure is a recess.

8. The electrical device according to claim 5, wherein the at least one optical diffuser is an area incorporated into the housing by the treatment and the material of which has been changed.

9. The electrical device according to claim 1, wherein the housing encloses an interior space of the electrical device entirely and/or on all sides, so that all provided electronic components are received in the housing.

10. A method of manufacturing the electrical device according to claim 1, comprising steps of:

providing the electrical device in the fully assembled state, the electrical device having the housing in which all electrical and/or electronic components of the electrical device are received; and manufacturing the light-decoupling part of the housing by the local mechanical, chemical and/or physical treatment of the housing in the fully assembled state in which all of the component parts of the electrical device are already connected to each other.

11. The method according to claim 10, wherein the local treatment of the housing is carried out by a mechanical removal of an opaque covering layer of the housing.

12. The method according to claim 10, wherein the local treatment of the housing is carried out by a laser ablation of an opaque covering layer of the housing.

13. The method according to claim 10, wherein the local treatment of the housing is carried out by selective exposure to light which changes the optical properties of the material of the housing.

14. The method according to claim 13, wherein the local treatment of the housing is carried out by a laser.

15. The method according to claim 10, wherein, before or after the manufacture of the light-decoupling part of the housing, only software associated with the light-decoupling part of the housing is installed to produce the operational electrical device.

16. The electrical device according to claim 1, wherein the light-decoupling part or the non-light-decoupling part produced by the local mechanical, chemical and/or physical treatment at least partially defines an outer surface of the housing.

17. An electrical device having an indicator light, comprising:

a housing that encloses an interior space of the electrical device on all sides, so that all electronic components of the electrical device are received in the housing; and a light source arranged in the housing and set up to couple light into a housing wall of the housing, wherein the light propagates through a material of the housing wall to a light-decoupling part of the housing, wherein the light emitted by the light source can exit the housing through the light-decoupling part of the housing, wherein the indicator light is formed by at least the light-decoupling part of the housing, wherein the light-decoupling part of the housing or a non-light-decoupling part of the housing which delimits the light-decoupling part of the housing is produced by a local mechanical, chemical and/or physical treatment of the housing, wherein the treatment is carried out in a fully assembled state of the electrical device.

18. The electrical device according to claim 17, wherein the light-decoupling part or the non-light-decoupling part produced by the local mechanical, chemical and/or physical treatment at least partially defines an outer surface of the housing.

* * * * *